United States Patent
Ishimasa et al.

(10) Patent No.: US 10,985,727 B2
(45) Date of Patent: Apr. 20, 2021

(54) PIEZOELECTRIC VIBRATOR

(71) Applicant: Murata Manufacturing Co., Ltd., Nagaokakyo (JP)

(72) Inventors: Mitsunori Ishimasa, Nagaokakyo (JP); Motoyoshi Sakai, Nagaokakyo (JP); Kazuyuki Noto, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 631 days.

(21) Appl. No.: 15/948,228

(22) Filed: Apr. 9, 2018

(65) Prior Publication Data

US 2018/0234077 A1  Aug. 16, 2018

Related U.S. Application Data (63) Continuation of application No. PCT/JP2016/066781, filed on Jun. 6, 2016.

(30) Foreign Application Priority Data

Oct. 21, 2015  (JP) .............................. JP2015-207239

(51) Int. Cl.
  *H03H 9/02* (2006.01)
  *H03H 9/05* (2006.01)
  (Continued)

(52) U.S. Cl.
  CPC .... *H03H 9/02086* (2013.01); *H03H 9/02023* (2013.01); *H03H 9/0509* (2013.01);
  (Continued)

(58) Field of Classification Search
  CPC ............. H03H 9/02086; H03H 9/0519; H03H 9/02023; H03H 9/0509; H03H 9/1021; H03H 9/132; H03H 9/19
  See application file for complete search history.

(56) References Cited

U.S. PATENT DOCUMENTS

2010/0073098 A1  3/2010 Ito
2013/0241358 A1*  9/2013 Mizusawa ................ G03F 7/40
                                                                  310/348
(Continued)

FOREIGN PATENT DOCUMENTS

JP    2000165086 A    6/2000
JP    2008104095 A    5/2008
(Continued)

OTHER PUBLICATIONS

International Search Report issued in International Application No. PCT/JP2016/066781, dated Aug. 23, 2016.
(Continued)

*Primary Examiner* — Jeffrey M Shin
(74) *Attorney, Agent, or Firm* — Arent Fox LLP (57) ABSTRACT

A piezoelectric vibrator includes a piezoelectric vibrating element, and a base member having a mounting surface to which the piezoelectric vibrating element is mounted, and a mount surface positioned on the opposite side to the mounting surface. The base member includes an electrode pattern formed at the mount surface that includes a ground electrode and a signal electrode that is electrically connected to the piezoelectric vibrating element. Moreover, the mount surface is a rectangular shape, the signal and ground electrodes are arranged in a region of the mount surface closer to any one side thereof, with the one side defining part of outer edges of the mount surface, and a distance from an outer edge of the signal electrode to the one side of the mount surface is longer than a distance from an outer edge of the ground electrode to the one side of the mount surface.

20 Claims, 4 Drawing Sheets

(51) Int. Cl.
    *H03H 9/10*         (2006.01)
    *H03H 9/13*         (2006.01)
    *H03H 9/19*         (2006.01)
    *H01L 23/12*       (2006.01)

(52) U.S. Cl.
    CPC ........ *H03H 9/0519* (2013.01); *H03H 9/1021* (2013.01); *H03H 9/132* (2013.01); *H03H 9/19* (2013.01); *H01L 23/12* (2013.01)

(56) References Cited

U.S. PATENT DOCUMENTS

2015/0155849 A1    6/2015    Kikuchi et al.
2019/0097476 A1*  3/2019    Miyamoto ............. H02K 15/02

FOREIGN PATENT DOCUMENTS

| JP | 2010073907 A | 4/2010 |
|---|---|---|
| JP | 2010081052 A | 4/2010 |
| JP | 2014030079 A | 2/2014 |
| JP | 2015126344 A | 7/2015 |
| JP | 2015128276 A | 7/2015 |

OTHER PUBLICATIONS

Written Opinion of the International Searching Authority issued in International Application No. PCT/JP2016/066781, dated Aug. 23, 2016.

* cited by examiner

PIEZOELECTRIC VIBRATOR

CROSS REFERENCE TO RELATED APPLICATIONS

The present application is a continuation of PCT/JP2016/066781 filed Jun. 6, 2016, which claims priority to Japanese Patent Application No. 2015-207239, filed Oct. 21, 2015, the entire contents of each of which are incorporated herein by reference.

TECHNICAL FIELD

The present disclosure relates to a piezoelectric vibrator.

BACKGROUND

Patent Document 1 (identified below) provides an example of piezoelectric vibrators for use in oscillation devices, band filters, and so on, in which a surface-mounted quartz vibrator includes a substrate to which a quartz vibrating element is mounted, and a metal cover formed on the substrate to cover the quartz vibrating element. Because of the necessity of suppressing, in the piezoelectric vibrator, an influence of noise incoming from the outside, the influence of noise incoming from the outside is suppressed in the surface-mounted quartz vibrator disclosed in Patent Document 1 by electrically connecting the metal cover and a ground terminal formed at a rear surface of the substrate via a through electrode that is formed inside the substrate, and by keeping the metal cover at a ground potential.

Patent Document 1: Japanese Unexamined Patent Application Publication No. 2015-128276.

However, the existing piezoelectric vibrator of Patent Document 1 has a problem that, even though the influence of noise incoming from the outside of the metal cover can be prevented, a signal line terminal formed at the rear surface of the substrate may receive noise from the outside, or noise may be generated from the signal line terminal to the outside. In addition, the piezoelectric vibrator must ensure convenience in mounting to a circuit board, for example.

SUMMARY OF THE INVENTION

Therefore, the present disclosure has been accomplished in view of the above-described situations, and an object of the present disclosure is to provide a piezoelectric vibrator that ensures convenience in mounting, and that reduces influences of not only noise received by a signal electrode from the outside of the piezoelectric vibrator, but also noise generated from the signal electrode to the outside of the piezoelectric vibrator.

According to one exemplary aspect of the present disclosure, a piezoelectric vibrator is provided that includes a piezoelectric vibrating element, and a base member having a mounting surface to which the piezoelectric vibrating element is mounted, and a mount surface positioned on an opposite side to the mounting surface. Moreover, the base member includes an electrode pattern formed at the mount surface, with the electrode pattern including a ground electrode and a signal electrode that is electrically connected to the piezoelectric vibrating element. In addition, the mount surface of the base member is formed in a rectangular shape, the signal electrode and the ground electrode are arranged in a region of the mount surface closer to any one side thereof with the one side defining part of outer edges of the mount surface, and a distance from an outer edge of the signal electrode to the one side of the mount surface is longer than a distance from an outer edge of the ground electrode to the one side of the mount surface.

According to the exemplary embodiments of the present disclosure, it is possible to ensure convenience in mounting, and to reduce influences of both noise received by the signal electrode from the outside of the piezoelectric vibrator, and also noise generated from the signal electrode to the outside of the piezoelectric vibrator.

DETAILED DESCRIPTION OF EMBODIMENTS

The exemplary embodiments of the present disclosure will be described below. In drawings referenced in the following description, the same or similar constituent elements are denoted by the same or similar signs. The drawings are merely illustrative, and dimensions and shapes of the individual constituent elements are schematically illustrated in the drawings. The technical scope of the invention should not be construed as being limited to the embodiments.

Thus, a piezoelectric vibrator according to a first exemplary embodiment is described with reference to FIGS. 1 and 2.

Figure 1:
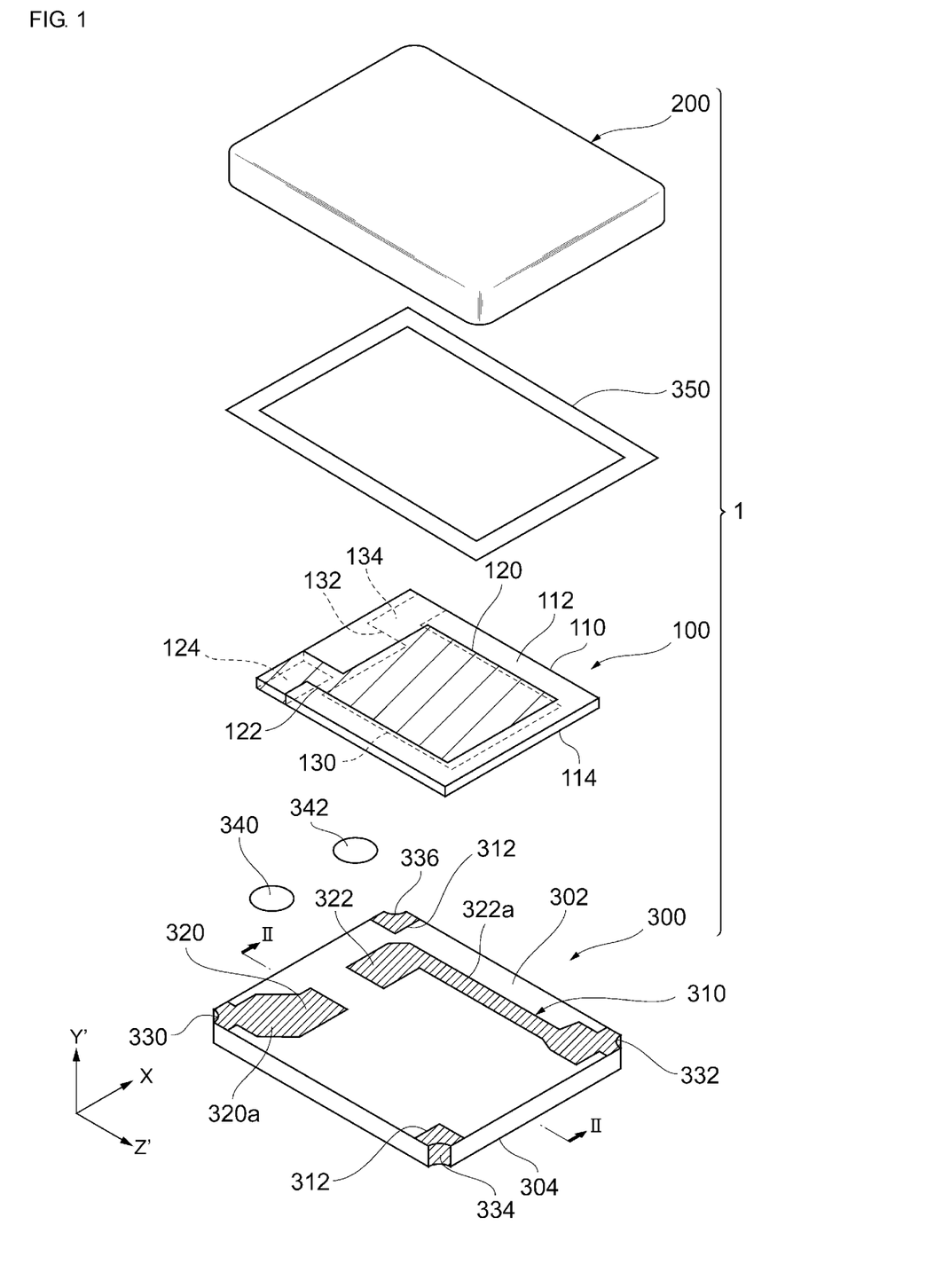
FIG. 1 is an exploded perspective view of a piezoelectric vibrator according to a first exemplary embodiment.
Figure 2:
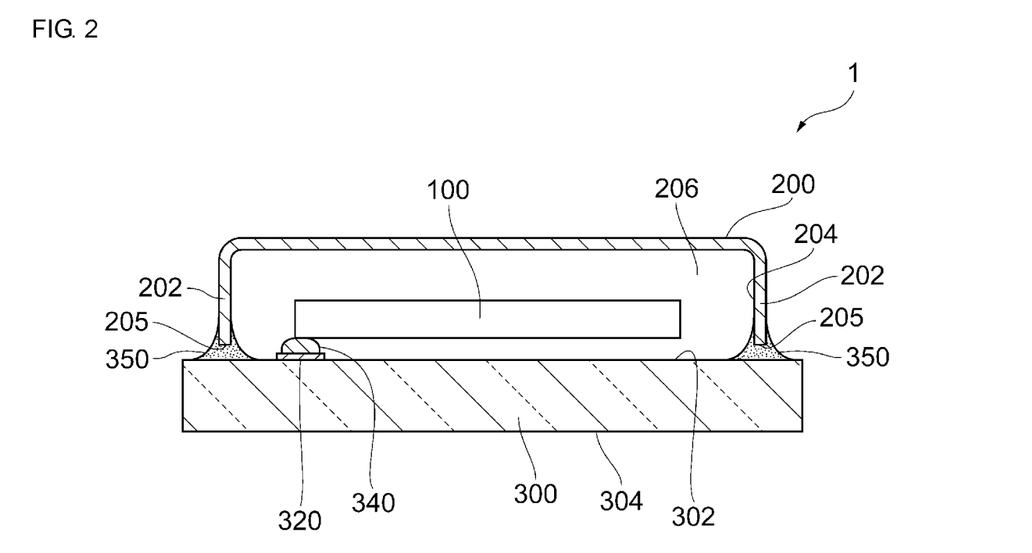
FIG. 2 is a sectional view taken along a line II-II in FIG. 1.

FIG. 1 is an exploded perspective view of the piezoelectric vibrator, and FIG. 2 is a sectional view taken along a line II-II in FIG. 1. It is to be noted that, in FIG. 2, various electrodes of a piezoelectric vibrating element are omitted.

As illustrated in FIG. 1, the piezoelectric vibrator 1 according to this exemplary embodiment includes a piezoelectric vibrating element 100, a cap 200 that is one example of a lid member, and a substrate 300 that is one example of a base member. The cap 200 and the substrate 300 form part of a case or a package in which the piezoelectric vibrating element 100 is to be disposed and sealed therein.

The piezoelectric vibrating element 100 includes a piezoelectric substrate 110, and first and second excitation electrodes 120 and 130 formed on or in the piezoelectric substrate 110. The first excitation electrode 120 is formed at a first surface 112 of the piezoelectric substrate 110, and the second excitation electrode 130 is formed at a second surface 114 of the piezoelectric substrate 110, the second surface 114 being positioned on the opposite side to the first surface 112.

Preferably, the piezoelectric vibrating element 100 is made of an appropriate piezoelectric material. Materials usable as the piezoelectric vibrating element 100 are not limited to particular one. In an example illustrated in FIG. 1, the piezoelectric vibrating element 100 is a quartz vibrating element including the piezoelectric substrate 110 that is an AT cut quartz substrate, and that has a rectangular shape. Assuming that, among an X-axis, a Y-axis, and a Z-axis constituting crystal axes of synthetic quartz crystal, the Y-axis and the Z-axis are rotated about the X-axis in a direction toward the Z-axis from the Y-axis through 35 degrees and 15 minutes±1 minute 30 seconds, and that the Y-axis and the Z-axis after the rotation are called a Y'-axis and a Z'-axis, respectively, the AT cut quartz substrate is a substrate cut to have, as a principal surface, a surface parallel to a plane that is defined by the X-axis and the Z'-axis (the plane being called an "XZ'" plane hereinafter; this is similarly applied to other planes defined by the other axes"). In the example illustrated in FIG. 1, the piezoelectric substrate 110 given as the AT cut quartz substrate has a lengthwise direction parallel to a direction of the Z'-axis, a widthwise direction parallel to a direction of the X-axis, and a thickness direction parallel to a direction of the Y'-axis. The piezoelectric substrate 110 has a substantially rectangular shape in the XZ'-plane. The quartz vibrating element using AT cut quartz substrate has very high frequency stability over a wide temperature range, is superior in time-dependent change characteristics, and can be manufactured at a low cost. Furthermore, the AT cut quartz vibrating element is used in many cases with the Thickness Shear Vibration Mode set to be a main vibration.

It should be appreciated that the piezoelectric substrate used in the exemplary embodiment is not limited to the above-described example. A rectangular AT cut quartz substrate having a lengthwise direction parallel to the direction of the X-axis and a widthwise direction parallel to the direction of the Z'-axis may be used in another example. As an alternative, a quartz substrate cut in a different way from the AT cut may also be used, or a different piezoelectric material, such as a ceramic other than quartz, may also be used.

The first excitation electrode 120 is formed at the first surface 112 (i.e., the XZ'-plane on the positive side in the direction of the Y'-axis), and the second excitation electrode 130 is formed at the second surface 114 (i.e., the XZ'-plane on the negative side in the direction of the Y'-axis) of the piezoelectric substrate 110, the second surface 114 being positioned on the opposite side to the first surface 112. The first and second excitation electrodes 120 and 130 are a pair of electrodes overlapping with each other when viewing the XZ'-plane from above.

Moreover, on or in the piezoelectric substrate 110, there are formed a connection electrode 124 that is electrically connected to the first excitation electrode 120 via a lead-out electrode 122, and a connection electrode 134 that is electrically connected to the second excitation electrode 130 via a lead-out electrode 132. More specifically, the lead-out electrode 122 is laid at the first surface 112 to extend from the first excitation electrode 120 toward a short side of the piezoelectric substrate 110 positioned on the negative side in the direction of the Z'-axis, and it is connected to the connection electrode 124 formed at the second surface 114 after passing over a lateral surface of the piezoelectric substrate 110 positioned on the negative side in the direction of the Z'-axis. On the other hand, the lead-out electrode 132 is laid at the second surface 114 to extend from the second excitation electrode 130 toward the short side of the piezoelectric substrate 110 positioned on the negative side in the direction of the Z'-axis, and it is connected to the connection electrode 134 formed at the second surface 114. The connection electrodes 124 and 134 are arranged along the short side of the piezoelectric substrate 110 positioned on the negative side in the direction of the Z'-axis. In addition, the connection electrodes 124 and 134 are electrically conducted to and mechanically held by the substrate 300 with later-described conductive support members 340 and 342 interposed therebetween, respectively. In this exemplary embodiment, layouts and pattern shapes of the connection electrodes 124 and 134 and the lead-out electrodes 122 and 132 are not limited to particular ones, and they may be changed as appropriate in consideration of electrical connections to other members.

The above-mentioned electrodes including the first and second excitation electrodes 120 and 130 may be each formed, for example, by forming a chromium (Cr) layer as an underlying layer, and then forming a gold (Au) layer on a surface of the chromium layer. However, it is noted that materials of those electrodes are not limited to particular ones.

The cap 200 includes a recessed portion 204 that is opened in a direction facing the first surface 302 of the substrate 300. The recessed portion 204 is surrounded by a sidewall portion 202 that is formed along an entire periphery of an opening of the recessed portion 204, and that rises from a bottom surface of the recessed portion 204. The sidewall portion 202 has an end surface 205 positioned to face the first surface 302 of the substrate 300. As illustrated in FIG. 2, the end surface 205 may be given as a distal end surface of the sidewall portion 202 projecting in a state of substantially vertically rise from the bottom surface of the recessed portion 204.

The cap 200 may be made of a conductive material such as a metal, or an insulating material such as a ceramic or quartz. When the cap 200 is made of a conductive material, a shield effect can be obtained by supplying a ground potential to the cap 200. In the case of the cap 200 being made of a metal, the cap 200 may be made of, for example, an alloy (e.g., 42 Alloy) containing iron (Fe) and nickel (Ni). Alternatively, a surface layer, such as a gold (Au) layer, may be further formed on a surface of the cap 200. Oxidation of the cap 200 can be prevented by forming the gold layer on the cap surface.

In one refinement of the exemplary embodiment, the cap 200 may include a flange further projecting from the sidewall portion 202 outward of the cap opening. With that modification, a contact area between the cap 200 and the substrate 300 can be increased by bonding the flange and the substrate 300 to each other. Hence bonding strength between the cap 200 and the substrate 300 can be increased.

The piezoelectric vibrating element 100 is mounted to the first surface 302 (mounting surface) of the substrate 300. In the example illustrated in FIG. 1, the substrate 300 has a lengthwise direction parallel to the direction of the Z'-axis, a widthwise direction parallel to the direction of the X-axis, and a thickness direction parallel to the direction of the Y'-axis. The substrate 300 has a substantially rectangular shape in the XZ'-plane. The substrate 300 may be made of an insulating ceramic, for example. Alternatively, the substrate 300 may be made of a glass material, a quartz material, a glass epoxy resin, or the like. Preferably, the substrate 300 is made of a heat-resistant material. The substrate 300 may be constituted by a single layer or multiple layers. When the substrate 300 is constituted by multiple layers, it may include an insulating layer formed as an outermost surface of the first surface 302. Furthermore, the substrate 300 may have a flat plate shape or a recessed shape opened in a direction facing the cap 200. By bonding the cap 200 and the substrate 300 to each other with a bonding material 350 interposed therebetween, as illustrated in FIG. 2, the piezoelectric vibrating element 100 is tightly sealed in an inner space (cavity) 206 that is surrounded by the recessed portion 204 of the cap 200 and the substrate 300.

The bonding material 350 is disposed over an entire periphery of the cap 200 or the substrate 300, and is interposed between the end surface 205 of the sidewall portion 202 of the cap 200 and the first surface 302 of the substrate 300. The bonding material 350 contains an insulating material. The insulating material may be, for example, a glass material (such as a low-melting-point glass) or a resin material (such as an epoxy-based resin). In the case of employing the above-mentioned insulating material, a cost is reduced in comparison with the case of metallic bonding, a heating temperature can be held at a lower level, and a manufacturing process can be simplified.

In an example illustrated in FIG. 2, one end of the piezoelectric vibrating element 100 (i.e., an end portion thereof on the side closer to the conductive support members 340 and 342) is a fixed end, and the other end is a free end. In a refinement of the exemplary embodiment, the piezoelectric vibrating element 100 may be fixed, at both ends in the lengthwise direction, to the substrate 300.

As illustrated in FIG. 1, an electrode pattern 310 is formed at the first surface 302 of the substrate 300. The electrode pattern 310 includes connection electrodes 320 and 322 to which the piezoelectric vibrating element 100 is connected, and lead-out electrodes 320a and 322a that are laid to extend from the connection electrodes 320 and 322 toward outer edges of the first surface 302. The connection electrodes 320 and 322 are arranged inward of an outer edge of the substrate 300 such that the piezoelectric vibrating element 100 can be positioned substantially at a center of the first surface 302 of the substrate 300.

The connection electrode 124 of the piezoelectric vibrating element 100 is connected to the connection electrode 320 with the conductive support member 340 interposed therebetween, while the connection electrode 134 of the piezoelectric vibrating element 100 is connected to the connection electrode 322 with the conductive support member 342 interposed therebetween. Both the conductive support members 340 and 342 support the piezoelectric vibrating element 100. The conductive support members 340 and 342 are conductive adhesives in a solidified state.

The lead-out electrode 320a is laid to extend from the connection electrode 320 toward any one of corners of the substrate 300, and the lead-out electrode 322a is laid to extend from the connection electrode 322 toward another one of the corners of the substrate 300. Moreover, a plurality of lateral electrodes 330, 332, 334 and 336 are formed at the corners of the substrate 300 in a one-to-one relation. In the example illustrated in FIG. 1, the lead-out electrode 320a is connected to the lateral electrode 330 that is formed at the corner on the negative side in the direction of the X-axis and on the negative side in the direction of the Z'-axis, while the lead-out electrode 322a is connected to the lateral electrode 332 that is formed at the corner on the positive side in the direction of the X-axis and on the positive side in the direction of the Z'-axis.

In this embodiment, the electrode pattern 310 further includes dummy patterns 312. As such, the dummy patterns 312 are patterns not electrically connected to the first and second excitation electrodes 120 and 130 of the piezoelectric vibrating element 100, and they are made of the same conductive material as that of the other electrodes. The dummy patterns 312 are formed near the remaining corners (i.e., the corners other than the corners where the lateral electrodes 330 and 332 electrically connected to the piezoelectric vibrating element 100 are arranged). By forming the dummy patterns 312, the conductive material can be more easily applied to form the lateral electrodes. Moreover, because the lateral electrodes can be formed at all the corners, a processing step of electrically connecting the piezoelectric vibrator to another member is also facilitated. In the exemplary aspect, the dummy patterns 312 function as ground electrodes to which a ground potential is supplied. In that case, the cap 200 is given with a shield function by supplying the ground potential to the dummy patterns 312 via the lateral electrodes 334 and 336, and by electrically connecting the conductive cap 200 to the dummy patterns 312. Additionally, the dummy patterns 312 may be each connected to a terminal disposed on or in a mounting substrate (not illustrated) to which the piezoelectric vibrator 1 is to be mounted (the terminal being not connected to any other electronic elements).

In the example illustrated in FIG. 1, each of the corners of the substrate 300 has a cut-out lateral surface that is formed by partly cutting the corner into the shape of a cylindrical curved surface (that shape being also called a castellation). The lateral electrodes 330, 332, 334 and 336 are each formed continuously over the cut-out lateral surface and the second surface 304 (mount surface). The corner shape of the substrate 300 is not limited to the above-described one. Thus, a cut-out formed at the corner may have a flat shape. Alternatively, an original edge shape of the corner may remain without forming the cut-out.

The configurations of the connection electrodes, the lead-out electrodes, and the lateral electrodes of the substrate 300 are not limited to the above-described examples, and those electrodes may be implemented in variously modified configurations. For instance, the connection electrodes 320 and 322 may be arranged at the first surface 302 of the substrate 300 on the different sides from each other such that one of the connection electrodes is formed on the positive side in the direction of the Z'-axis, and that the other connection electrode is formed on the negative side in the direction of the Z'-axis. In such an arrangement, the piezoelectric vibrating element 100 is supported on the substrate 300 at both of the one end and the other end thereof in the lengthwise direction. Furthermore, the number of the lateral electrodes is not limited to four. In another example, three lateral electrodes in total may be provided; namely, two lateral electrodes electrically connected to the piezoelectric vibrating element, and one lateral electrode that is an electrode for grounding. Moreover, the lateral electrode is not limited to the electrode arranged at the corner, and it may be formed at any lateral surface of the substrate 300 other than the corners. In that case, the cut-out lateral surface may be formed by cutting part of the lateral surface into the shape of a cylindrical curved surface in a similar manner to that described above, and the lateral electrode may be formed at the relevant lateral surface other than the corners.

Figure 3:
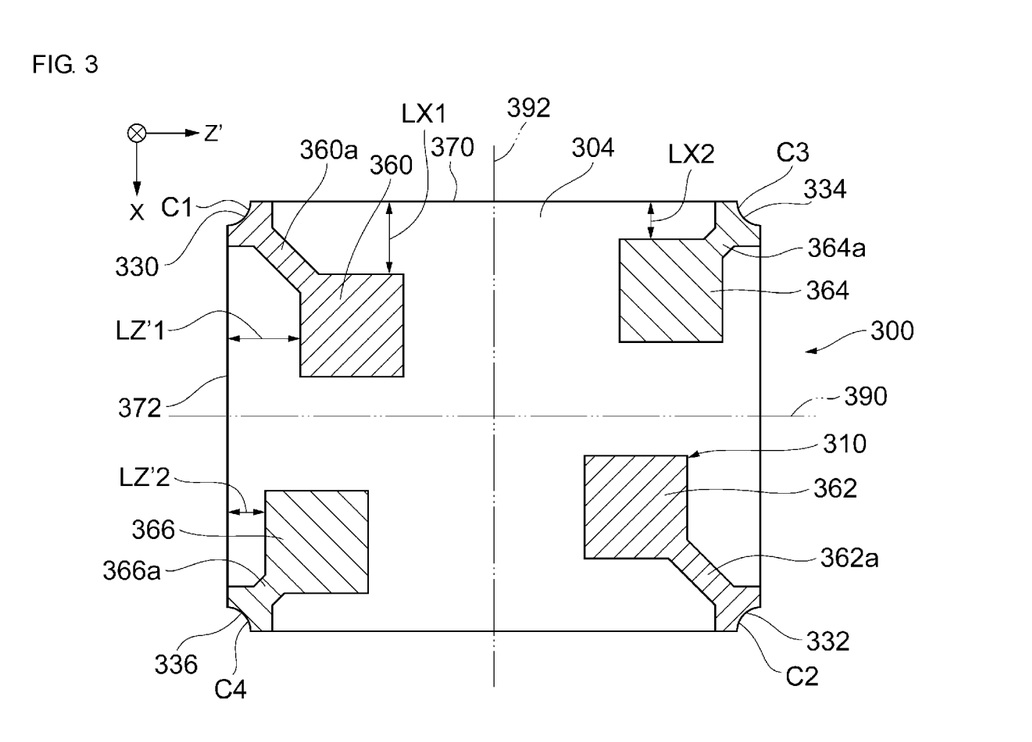
FIG. 3 is a plan view of a mount surface of a base member in the first exemplary embodiment.

The configuration of the electrode pattern 310 formed at the second surface 304 (mount surface) of the substrate 300 will be described in more detail below with reference to FIG. 3. FIG. 3 is a plan view of the second surface 304 of the substrate 300. The following description is made about the case where the electrode pattern 310 includes two signal electrodes (i.e., for an input and an output) and two ground electrodes.

As illustrated in FIG. 3, the electrode pattern 310 includes signal electrodes 360 and 362, ground electrodes 364 and 366, and lead-out electrodes 360a, 362a, 364a, and 366a that are electrically connected to the corresponding electrodes.

The signal electrodes 360 and 362 are electrically connected to the first and second excitation electrodes 120 and 130 of the piezoelectric vibrating element 100, respectively, and they transfer input/output signals with respect to the piezoelectric vibrator 1. In other words, the signal electrodes 360 and 362 function as input/output electrodes of the piezoelectric vibrator 1 in operation.

The signal electrodes 360 and 362 are arranged in regions of the second surface 304 closer to one pair of corners diagonally opposing to each other. More specifically, the signal electrode 360 is arranged in a region of the second surface 304 closer to a corner C1 on the negative side in the direction of the X-axis and on the negative side in the direction of the Z'-axis, while the signal electrode 362 is arranged in a region of the second surface 304 closer to a corner C2 on the positive side in the direction of the X-axis and on the positive side in the direction of the Z'-axis. Here, for example, the region closer to the corner C1 implies one among four regions obtained by dividing the second surface 304 of the substrate 300 along imaginary center lines 390 and 392 (i.e., into four quadrants) that are perpendicular to each other, the one including the corner C1. The above point is similarly applied to the regions closer to the other corners.

The signal electrode 360 is electrically connected to the lateral electrode 330 via the lead-out electrode 360a that is laid to extend toward the corner C1 on the negative side in the direction of the X-axis and on the negative side in the direction of the Z'-axis. The signal electrode 362 is electrically connected to the lateral electrode 332 via the lead-out electrode 362a that is laid to extend toward the corner C2 on the positive side in the direction of the X-axis and on the positive side in the direction of the Z'-axis. Thus, the signal electrodes 360 and 362 can be electrically conducted to the side including the first surface 302 of the substrate 300 via the lead-out electrodes 360a and 362a and the lateral electrodes 330 and 332, and they are electrically connected to the first and second excitation electrodes 120 and 130 at the first surface 302 via the connection electrodes 320 and 322, respectively.

The ground electrodes 364 and 366 are electrodes that are not electrically connected to the first and second excitation electrodes 120 and 130 of the piezoelectric vibrating element 100, and to which the ground potential is supplied from the outside. In other words, the ground electrodes 364 and 366 function as ground electrodes of the piezoelectric vibrator 1 during operation.

The ground electrodes 364 and 366 are arranged in regions of the second surface 304 closer to the other pair of corners diagonally opposing to each other. More specifically, the ground electrode 364 is arranged in a region of the second surface 304 closer to a corner C3 on the negative side in the direction of the X-axis and on the positive side in the direction of the Z'-axis, while the ground electrode 366 is arranged in a region of the second surface 304 closer to a corner C4 on the positive side in the direction of the X-axis and on the negative side in the direction of the Z'-axis.

The ground electrode 364 is electrically connected to the lateral electrode 334 via the lead-out electrode 364a that is laid to extend toward the corner C3 on the negative side in the direction of the X-axis and on the positive side in the direction of the Z'-axis. The ground electrode 366 is electrically connected to the lateral electrode 336 via the lead-out electrode 366a that is laid to extend toward the corner C4 on the positive side in the direction of the X-axis and on the negative side in the direction of the Z'-axis. Thus, the ground electrodes 364 and 366 are made capable of being electrically conducted to the side including the first surface 302 of the substrate 300 via the lead-out electrodes 364a and 366a and the lateral electrodes 334 and 336, and they are electrically connected to the dummy patterns 312 at the first surface 302.

In the piezoelectric vibrator 1 according to this embodiment, when an AC voltage is applied between the pair of first and second excitation electrodes 120 and 130 of the piezoelectric vibrating element 100 via the signal electrodes 360 and 362, the piezoelectric substrate 110 is caused to vibrate in a predetermined vibration mode, for example, the Thickness Shear Vibration Mode, and resonance characteristics are obtained with the vibration of the piezoelectric substrate 110.

In this embodiment, the signal electrode 360 and the ground electrode 364 are arranged in a region of the substrate 300 closer to one side (first side 370) thereof, the one side being positioned parallel to the Z'-axis on the negative side in the direction of the X-axis, while the signal electrode 362 and the ground electrode 366 are arranged in a region of the substrate 300 closer to another side thereof, the other side being positioned parallel to the Z'-axis on the positive side in the direction of the X-axis. Furthermore, the signal electrode 360 and the ground electrode 366 are arranged in a region of the substrate 300 closer to still another side (second side 372) thereof, the still other side being positioned parallel to the X-axis on the negative side in the direction of the Z'-axis, while the signal electrode 362 and the ground electrode 364 are arranged in a region of the substrate 300 closer to still another side thereof, the still other side being positioned parallel to the X-axis on the positive side in the direction of the Z'-axis. Here, for example, the region closer to the first side 370 implies one of two regions obtained by dividing the second surface 304 of the substrate 300 along the imaginary center line 390 that is parallel to the first side 370, the one region including the first side 370. The above point is similarly applied to the regions closer to the other sides.

Arrangements of the signal electrodes relative to the ground electrodes will be described below by taking the signal electrode 360 as an example. As illustrated in FIG. 3, the signal electrode 360 is a rectangular electrode, and two orthogonal sides of the signal electrode 360 are positioned parallel to sides of the substrate 300, the latter sides being adjacent to the former orthogonal sides, respectively. The signal electrode 360 is arranged in a region of the second surface 304 of the substrate 300, which is closer to the first side 370 positioned parallel to the Z'-axis on the negative side in the direction of the X-axis, and which is closer to the second side 372 positioned parallel to the X-axis on the negative side in the direction of the Z'-axis, the first side 370 and the second side 372 defining parts of outer edges of the second surface 304 of the substrate 300. It is now assumed that, when taken in the direction of the X-axis, a distance between an outer edge of the signal electrode 360 (i.e., the side closest to first side 370) having a rectangular shape and the first side 370 is denoted by LX1, and a distance between an outer edge of the ground electrode 364 (i.e., the side closest to first side 370) having a rectangular shape and the first side 370 is denoted by LX2. On that assumption, the signal electrode 360 and the ground electrode 364 are arranged so as to satisfy LX1>LX2 in the exemplary embodiment. It is further assumed that, when taken in the direction of the Z'-axis, a distance between an outer edge of the signal electrode 360 and the second side 372 is denoted by LZ'1, and a distance between an outer edge of the ground electrode 366 and the second side 372 is denoted by LZ'2. On that assumption, the signal electrode 360 and the ground electrode 366 are arranged so as to satisfy LZ'1>LZ'2 in the exemplary embodiment. In other words, the signal electrode 360 is arranged on or in the substrate 300 on the inner side than the ground electrode 364 in the direction of the X-axis, and on the inner side than the ground electrode 366 in the direction of the Z'-axis.

In this embodiment, as described above, the signal electrode 360 is arranged on or in the substrate 300 on the inner side than the ground electrodes 364 and 366. With that arrangement, even when a noise generation source is present around the piezoelectric vibrator 1, a distance between the noise generation source and the signal electrode 360 can be held relatively long, and an influence of noise acting on the signal electrode 360 from the outside of the piezoelectric vibrator 1 can advantageously be reduced. Moreover, an influence of noise generated from the signal electrode 360 toward the outside of the piezoelectric vibrator 1 can also be reduced for the same reason.

In this embodiment, as with the signal electrode 360, the signal electrode 362 is also arranged on or in the substrate 300 on the inner side than the ground electrodes 364 and 366. Accordingly, similar advantageous effects to those described above in connection with the signal electrode 360 can also be obtained with the signal electrode 362.

Furthermore, in this embodiment, since the ground electrodes 364 and 366 are arranged on the outer side than the signal electrodes 360 and 362, the occurrence of not only position deviations of the substrate 300 in a rotation direction about the Y'-axis and in a direction along the XZ'-plane, but also an inclination deviation of the substrate 300 in the direction of the Y'-axis in the step of mounting the piezoelectric vibrator 1 can be more reliably suppressed than, for example, in the case of uniformly arranging all the four electrodes near a center of the substrate 300. As a result, stability in the step of mounting the piezoelectric vibrator 1 can be ensured.

While, in an example illustrated in FIG. 3, the signal electrodes 360 and 362 are both arranged on or in the substrate 300 on the inner side than the ground electrodes 364 and 366, only one of the signal electrodes 360 and 362 may be arranged on or in the substrate 300 on the inner side. While, in the example illustrated in FIG. 3, the signal electrodes 360 and 362 are arranged on or in the substrate 300 on the inner side than the ground electrodes 364 and 366 in both the direction of the X-axis and the direction of the Z'-axis, the signal electrodes 360 and 362 may be arranged on or in the substrate 300 on the inner side than only in one of the direction of the X-axis and the direction of the Z'-axis.

The configurations of the signal electrodes, the ground electrodes, and the lead-out electrodes of the substrate 300 are not limited to the above-described examples, and those electrodes may be implemented in variously modified configurations. For instance, shapes of the signal electrodes 360 and 362 and the ground electrodes 364 and 366 are not limited to the rectangular shape shown in FIG. 3, and those electrodes may optionally have other shapes, such as circular and polygonal shapes. Furthermore, sizes of the signal electrodes and the ground electrodes may be different from each other. For instance, the signal electrodes may be arranged on or in the substrate 300 on the inner side than the ground electrodes by designing external sizes of the signal electrodes to be smaller than those of the ground electrodes. The number of the signal electrodes and the ground electrodes is limited to four in total, and a total of three electrodes, i.e., two signal electrodes and one ground electrode, may be provided. In addition, the lead-out electrodes disposed on the mount surface side are not limited to electrodes that are laid to extend toward the corners, and the layout of those lead-out electrodes may be modified as appropriate depending on the arrangement of the lateral electrodes. For instance, those lead-out electrodes may be each laid to extend up to a lateral electrode that is formed at any of the lateral surfaces of the substrate 300 other than the corners.

A modification of the piezoelectric vibrator according to the first exemplary embodiment will be described below with reference to FIG. 4. It is to be noted that, in the following modification and embodiment, description regarding matters common to the first exemplary embodiment is omitted, and only different points are described. In particular, similar advantageous effects obtained with similar features are not repeatedly described per embodiment.

Figure 4:
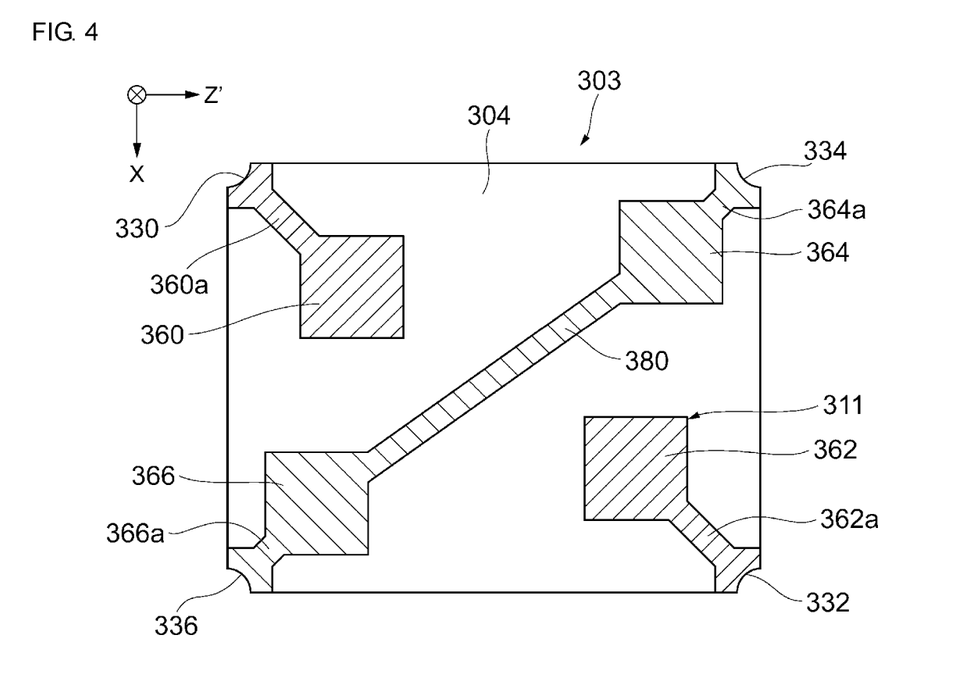
FIG. 4 is a plan view of a mount surface of a base member in a modification of the first exemplary embodiment.

FIG. 4 is a plan view of a second surface 304 of a substrate 303 in the modification of the first exemplary embodiment. In this modification, an electrode pattern 311 includes a connection electrode 380 on the second surface 304. The connection electrode 380 is formed to extend across a space between the signal electrode 360 and the signal electrode 362, thereby electrically connecting the ground electrode 364 and the ground electrode 366 to each other.

In this modification, as illustrated in FIG. 4, the connection electrode 380 is formed to interconnect the ground electrode 364 and the ground electrode 366 along a diagonal line of the second surface 304.

With such an arrangement, since the signal electrode 360 and the signal electrode 362 are shielded on the second surface 304 by the connection electrode 380 that is held at the ground potential, it is possible to reduce an influence of noise acting from one of the signal electrode 360 and the signal electrode 362 on the other electrode. As a result, the effect of reducing the noise influence is enhanced in comparison with that obtained in the embodiment illustrated in FIG. 3.

A piezoelectric vibrator 3 according to a second exemplary embodiment will be described below with reference to FIGS. 5 and 6.

Figure 5:
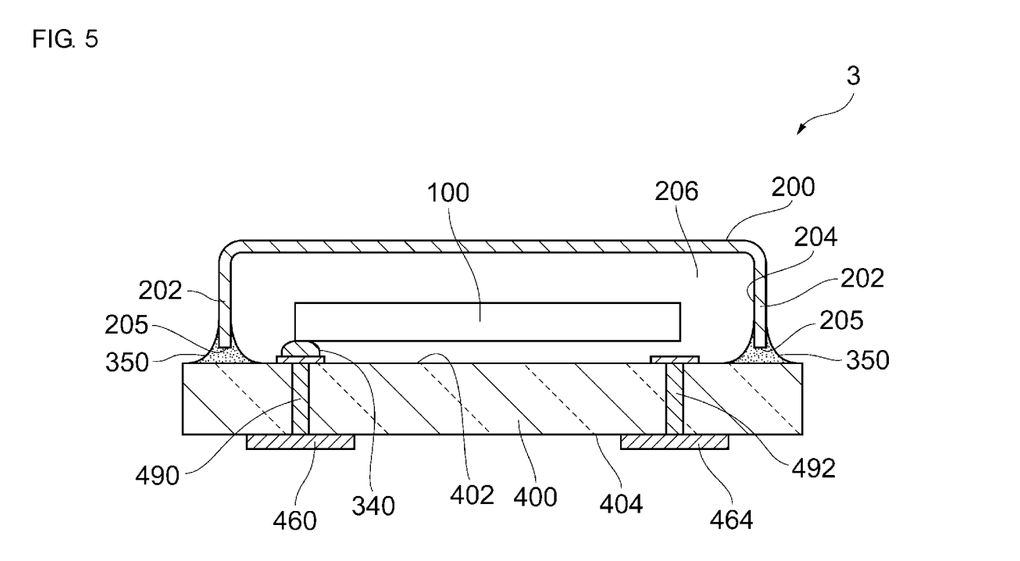
FIG. 5 is a sectional view of a piezoelectric vibrator according to a second exemplary embodiment.
Figure 6:
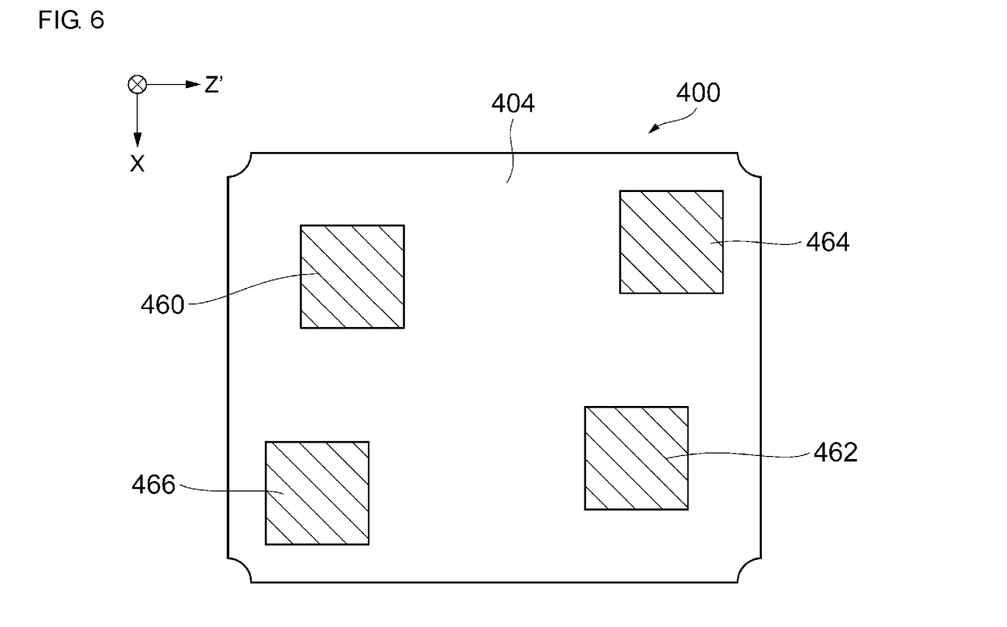
FIG. 6 is a plan view of a mount surface of a base member in the second exemplary embodiment.

FIG. 5 is a sectional view of the piezoelectric vibrator 3 according to the second exemplary embodiment, and FIG. 6 is a plan view of a base member in the second exemplary embodiment. The following description is made by taking the signal electrode 460 and the ground electrode 464 as an example.

In this embodiment, as illustrated in FIG. 5, through electrodes 490 and 492 are formed in a region of a substrate 400, which is one example of the base member, the region being positioned inside the cap 200, and they penetrate through the substrate 400 from a first surface 402 to a second surface 404 thereof. With the provision of the through electrodes 490 and 492, electrical conduction is established between the first surface 402 to which the piezoelectric vibrating element 100 is mounted and the second surface 404 opposing to the first surface 402. Such an arrangement enables the signal electrode 460 to be electrically connected to the piezoelectric vibrating element 100 without passing, for example, the lead-out electrode at the second surface 404 of the substrate 400. The ground electrode 464 may also be electrically connected to the dummy pattern 312 on the first surface 402 of the substrate 400 via the through electrode 492. In addition, as with the signal electrode 460 and the ground electrode 464, the signal electrode 462 and the ground electrode 466 may also be electrically conducted to the first surface 402 via other through electrodes.

In this exemplary embodiment, the signal electrode and the ground electrode can be electrically connected to the piezoelectric vibrating element 100 and the dummy patterns 312 via the above-described through electrodes. As illustrated in FIG. 6, therefore, the substrate 400 can be formed in such a configuration that the lead-out electrodes corresponding to the signal electrode and the ground electrode are not provided at the second surface 404 of the substrate 400.

This embodiment can also provide similar advantageous effects to those obtained in the first embodiment as described above.

The exemplary embodiments of the present disclosure have been described above. In the piezoelectric vibrator 1, the signal electrode 360 or 362 is arranged on or in the substrate 300 on the inner side (i.e., closer to the center) than the ground electrode 364 or 366. With that arrangement, even when a noise generation source is present around the piezoelectric vibrator 1, a distance between the noise generation source and the signal electrode can be held relatively long, and an influence of noise acting on the signal electrode from the outside of the piezoelectric vibrator 1 can be reduced. Moreover, an influence of noise generated from the signal electrode toward the outside of the piezoelectric vibrator 1 can also be reduced for the same reason. In addition, since the ground electrodes 364 and 366 are arranged on the outer side than the signal electrodes 360 and 362, stability in the step of mounting the piezoelectric vibrator 1 can be ensured.

In the modification of the first exemplary embodiment, the connection electrode 380 electrically connecting the ground electrode 364 and the ground electrode 366 to each other is formed to extend across the space between the signal electrode 360 and the signal electrode 362 on the second surface 304 of the substrate 300. With that arrangement, since the signal electrode 360 and the signal electrode 362 are shielded by the connection electrode 380 that is held at the ground potential, the effect of reducing the noise influence is enhanced in comparison with that obtained in the first embodiment.

In the second exemplary embodiment, the through electrodes are formed in the substrate 400 so as to penetrate therethrough from the first surface 402 to the second surface 404, and the signal electrode and the ground electrode are electrically connected to the corresponding electrodes on the first surface 402 of the substrate 400 via the through electrodes. With the provision of the through electrodes, similar advantageous effects to those in the first embodiment can also be obtained without forming any lead-out electrodes on the second surface 404, for example.

While, in the above embodiments, the quartz vibrating element has been described as one example of the piezoelectric vibrating element, the exemplary embodiments are so not limited to such an example, and other piezoelectric materials, such as piezoelectric ceramics (e.g., PZT) or zinc oxide, may also be used. Moreover, the piezoelectric vibrating element may be, for example, MEMS (Micro Electro Mechanical Systems). Thus, the piezoelectric vibrating element may be piezoelectric MEMS using an appropriate piezoelectric material such as Si-MEMS, AlN, LT, or PZT, for example.

In any of the above exemplary embodiments, when the cap 200 is made of a conductive material such as a metal, the cap may be maintained at the ground potential by electrically connecting the cap 200 to the ground electrode.

While, in the above embodiments, the cap having the recessed portion has been described as one example of the lid member, the exemplary embodiments are not so limited to such an example, and a lid member in the form of a flat plate may be employed. In that case, an inner space in which the piezoelectric vibrator is to be arranged may be formed by forming a substrate, serving as the base member, into a recessed shape.

It is to be noted that the above-described exemplary embodiments are merely illustrative with intent to make easier understanding of the present disclosure, and they should not be construed as limiting the present invention. The present invention can be modified and/or improved without departing from the gist of the invention, and the present invention includes equivalents to the matters disclosed in the present invention as well. In other words, modifications resulting from changing designs of the embodiments as appropriate by those skilled in the art are also included in the scope of the present invention insofar as having the features of the present invention. For instance, individual constituent elements in the embodiments, and layouts, materials, conditions, shapes, sizes, etc. of those constituent elements are not limited to the illustrated ones, and they may be changed as appropriate. In addition, the constituent elements in the embodiments may be combined with each other insofar as being technically allowable, and resulted combinations of the constituent elements are also included in the scope of the present invention insofar as having the features of the present invention.

REFERENCE SIGNS LIST 1, 3 piezoelectric vibrator
100 piezoelectric vibrating element
200 cap (lid member)
300, 400 substrate (base member)
310, 311 electrode pattern
312 dummy pattern
320, 322, 380 connection electrode
320a, 322a, 360a, 362a, 364a, 366a lead-out electrode
350 bonding material
360, 362, 460, 462 signal electrode
364, 366, 464, 466 ground electrode
490, 492 through electrode

The invention claimed is:
1. A piezoelectric vibrator comprising:
a piezoelectric vibrating element;
a base member having a mounting surface to which the piezoelectric vibrating element is mounted, and a mount surface on an opposite side of the base member from the mounting surface; and
an electrode pattern disposed on the mount surface and including a ground electrode and a signal electrode that is electrically connected to the piezoelectric vibrating element, with each of the ground and signal electrodes having a rectangular shape,
wherein the mount surface of the base member comprises a rectangular shape and the signal electrode and the ground electrode are disposed in a region of the mount surface closer to one side thereof that defines an outer edge of the mount surface,
wherein the signal electrode is disposed on the mount surface on an inner side relative to the ground electrode, and
wherein a distance from an outer edge of the signal electrode to the one side of the mount surface is greater than a distance from an outer edge of the ground electrode to the one side of the mount surface.
2. The piezoelectric vibrator according to claim 1, wherein the electrode pattern includes first and second ground electrodes as the ground electrode, and includes at least one of first and second signal electrodes as the signal electrode.

3. The piezoelectric vibrator according to claim 2, wherein the first and second ground electrodes are disposed in respective regions of the mount surface closer to a first pair of opposing corners thereof, and
wherein the at least one of the first and second signal electrodes are disposed in a respective region of the mount surface closer to a second pair of opposing corners thereof.

4. The piezoelectric vibrator according to claim 2, wherein the electrode pattern further includes a lead-out electrode that is electrically connected to at least one of the first and second ground electrodes and the at least one of the first and second signal electrodes.

5. The piezoelectric vibrator according to claim 2, wherein the electrode pattern further includes a through electrode with which at least one of the first and second ground electrodes and the at least one first and second signal electrodes is electrically coupled to the mounting surface of the base member.

6. The piezoelectric vibrator according to claim 2, wherein the electrode pattern further includes a connection electrode that electrically connects the first ground electrode to the second ground electrode.

7. The piezoelectric vibrator according to claim 6, wherein the connection electrode extends between the first signal electrode and the second signal electrode on the mount surface.

8. The piezoelectric vibrator according to claim 2, further comprising a lid member that is bonded to the mounting surface of the base member to seal the piezoelectric vibrating element therein.

9. The piezoelectric vibrator according to claim 8, wherein the lid member comprises a metal, and the first and second ground electrodes are electrically connected to the lid member.

10. The piezoelectric vibrator according to claim 1, wherein the piezoelectric vibrating element is a quartz vibrating element.

11. A piezoelectric vibrator comprising:
a base member having a mounting surface configured to be connected to a piezoelectric vibrating element, and a mount surface opposite the mounting surface; and
an electrode pattern disposed on the mount surface of the base member, and including at least one rectangular ground electrode and at least one rectangular signal electrode electrically connected to the piezoelectric vibrating element,
wherein the at least one rectangular signal electrode and the at least one rectangular ground electrode are each disposed on the mount surface closer to one outer edge of the mount surface than other outer edges of the mount surface, and
wherein a side of the at least one rectangular ground electrode that is an outer edge closest to the one outer edge of the mount surface is closer than a side of the at least one rectangular signal electrode that is an outer edge closest to the one outer edge of the mount surface.

12. The piezoelectric vibrator according to claim 11, wherein the at least one rectangular signal electrode is disposed on the mount surface closer to a center of the mount surface than the at least one rectangular ground electrode.

13. The piezoelectric vibrator according to claim 11, wherein the at least one rectangular ground electrode includes first and second ground electrodes and the at least one rectangular signal electrode includes first and second signal electrodes.

14. The piezoelectric vibrator according to claim 13, wherein the first and second ground electrodes are disposed in respective regions of the mount surface closer to a first pair of opposing corners thereof, and
wherein the first and second signal electrodes are disposed in respective regions of the mount surface closer to a second pair of opposing corners thereof.

15. The piezoelectric vibrator according to claim 13, wherein the electrode pattern further includes a lead-out electrode that is electrically connected to at least one of the first and second ground electrodes and at least one of the first and second signal electrodes.

16. The piezoelectric vibrator according to claim 13, wherein the electrode pattern further includes a through electrode with which at least one of the first and second ground electrodes and the first and second signal electrodes is electrically coupled to the mounting surface of the base member.

17. The piezoelectric vibrator according to claim 13, wherein the electrode pattern further includes a connection electrode that electrically connects the first ground electrode to the second ground electrode.

18. The piezoelectric vibrator according to claim 17, wherein the connection electrode extends between the first signal electrode and the second signal electrode on the mount surface.

19. The piezoelectric vibrator according to claim 13, further comprising a lid member that is bonded to the mounting surface of the base member to seal the piezoelectric vibrating element therein.

20. The piezoelectric vibrator according to claim 19, wherein the lid member comprises a metal, and the first and second ground electrodes are electrically connected to the lid member.

* * * * *